(12) United States Patent
Carpenter et al.

(10) Patent No.: US 8,633,398 B2
(45) Date of Patent: Jan. 21, 2014

(54) CIRCUIT BOARD CONTACT PADS

(75) Inventors: David G. Carpenter, Cypress, TX (US); Patrick A. Raymond, Houston, TX (US); Jaime E. Llinas, Houston, TX (US); Richard A. Barnett, Houston, TX (US); John Hua, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 132 days.

(21) Appl. No.: 13/281,110

(22) Filed: Oct. 25, 2011

(65) Prior Publication Data

US 2013/0100624 A1 Apr. 25, 2013

(51) Int. Cl.
*H05K 1/11* (2006.01)
*H05K 3/30* (2006.01)

(52) U.S. Cl.
USPC .............................. 174/260; 174/262; 29/832

(58) Field of Classification Search
USPC ...................... 174/260, 262–266; 29/832–841
See application file for complete search history.

(56) References Cited

U.S. PATENT DOCUMENTS

| | | | | |
|---|---|---|---|---|
| 4,882,656 | A * | 11/1989 | Menzies et al. | 361/734 |
| 5,761,049 | A * | 6/1998 | Yoshidome et al. | 361/782 |
| 6,859,352 | B1 | 2/2005 | Kanasaki et al. | |
| 7,239,014 | B2 | 7/2007 | Ogawa et al. | |
| 7,292,450 | B2 | 11/2007 | Larsen et al. | |
| 7,312,402 | B2 * | 12/2007 | Antu et al. | 174/260 |
| 7,323,787 | B2 | 1/2008 | Chan et al. | |
| 7,495,884 | B2 | 2/2009 | Togashi et al. | |
| 7,501,586 | B2 * | 3/2009 | Wig et al. | 174/262 |
| 7,503,111 | B2 | 3/2009 | Haridass et al. | |
| 7,746,660 | B1 * | 6/2010 | Duong | 361/767 |

\* cited by examiner

*Primary Examiner* — Jeremy Norris

(57) ABSTRACT

The present disclosure provides a circuit board with a first via and a second via, the first and second vias providing an electrical path from a top surface of the circuit board to a bottom surface of the circuit board. The circuit board also includes a first contact pad electrically coupled to the first via and a second contact pad electrically coupled to the second via. The first contact pad is disposed at an angle with respect to a reference line crossing through the center of the first and second vias, and the second contact pad is disposed on an opposite side of the reference line at the angle with respect to the reference line, such that a footprint that encompasses an area between the first and second contact pads does not cover the first and second vias.

20 Claims, 4 Drawing Sheets

100

400

US 8,633,398 B2

CIRCUIT BOARD CONTACT PADS

BACKGROUND

Reducing the size of electronic devices presents various technical challenges. As computer chips become smaller, techniques for mounting those chips to circuit boards become increasingly complex. One technique that is often used for mounting chips to circuit boards is referred to as ball grid array, wherein solder balls are disposed on electrical contacts at the bottom of the chip. The solder balls are soldered to corresponding contact pads on the circuit board. The circuit board's contact pads may be electrically coupled to conductive through holes, referred to as vias, that provide routing of signals from the chip to other components mounted to the circuit board. Chips such as Application Specific Integrated circuits (ASICs) often include power and ground connections to the circuit board. Capacitors, often referred to as "bypass capacitors" or "decoupling capacitors," are usually coupled across the power and ground connections to filter out unwanted electrical noise that may be generated by the power supply. The bypass capacitors may be disposed on the bottom side of the circuit board within the footprint of the ASIC.

As chips such as ASICs grow in complexity, and shrink in size, the ball pitch grid pattern also shrinks. As the ball pitch grid patterns become smaller, less room is available on the circuit board for components such as bypass capacitors. One technique that has been developed to overcome this challenge is referred to as "Via in Pad," which enables the bypass capacitors to be disposed directly under the via, in other words, covering the via on the bottom side of the circuit board. However, the Via in Pad technique adds additional cost to the process of fabricating the circuit board. For example, Via in Pad typically use a via filling and plating process, referred to as Plated Over Filled Via (POFV), which introduces significant manufacturing cost for each circuit board.

BRIEF DESCRIPTION OF THE DRAWINGS

Certain embodiments are described in the following detailed description and in reference to the drawings, in which.

DETAILED DESCRIPTION

Embodiments described herein relate to an improved component layout for a circuit board. The component layout in accordance with embodiments uses smaller components, which are spaced away from the vias and rotated to fit within the available area between the vias. This new component layout enables the elimination of the Plated Over Filled Via (POFV) process, resulting in significant cost savings. In embodiments, the improved component layout is used to place bypass capacitors on the bottom side of a circuit board, which is configured to receive an Application Specific Integrated Circuit (ASIC). Previous generations of ASICs had a 1.0 mm grid array which allowed for traces to be routed between the pads and vias. However, newer generations of ASICs use a 0.8 mm, or smaller, grid array, which significantly reduces the amount of area available for routing and component placement between the vias.

Figure 1:
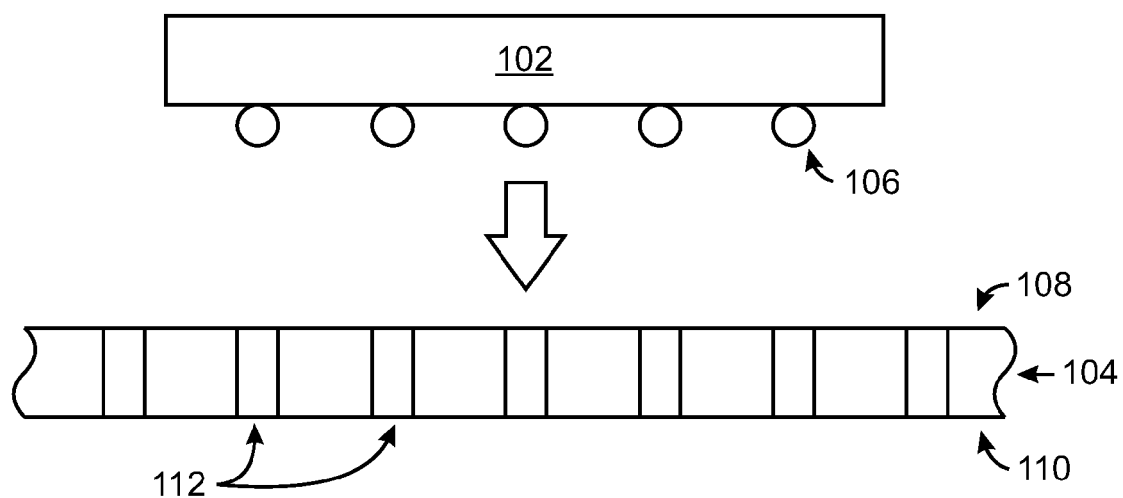
FIG. 1 is a side view of an electronic device in accordance with embodiments.

FIG. 1 is a side view of an electronic device in accordance with embodiments. The electronic device 100 may be any suitable device, such as a general purpose computer, server, notebook computer, workstation, mobile phone, smart phone, tablet PC, or digital camera, among others. The electronic device 100 includes a circuit chip 102 mounted to a circuit board 104. It will be appreciated that the electronic device 100 includes many other circuits and components, which, for the sake of clarity, are not shown in FIG. 1. Further, the circuit board 104 and circuit chip 102 are not drawn to scale.

The circuit chip 102 may be any suitable type of circuit chip, such as an Application Specific Integrated Circuit (ASIC), field-programmable gate array (FPGA), general purpose microprocessor, or any SMT (Surface-Mount Technology) device that involves the placement of passive components within the BGA array. The circuit chip 102 may be electrically coupled to the circuit board 104 using a surface mount packaging technique known as "ball grid array," which uses an array of solder balls 106 disposed on a bottom surface of the circuit chip. The circuit board 104 may be a printed circuit board (PCB) or any other suitable type of circuit board. The circuit board 104 includes a top surface 108 and a bottom surface 110. The top surface 108 of the circuit board 104 refers to the surface to which the circuit chip 102 is mounted, and the bottom surface 110 refers to the surface opposite the top surface 108. An array of contact pads (not shown) may be disposed on the top surface 108 of the circuit board 104 in a pattern that matches the array of solder balls 106. The solder balls 106 of the circuit chip 102 are placed in contact with the array of conductive pads and heated to form a conductive bond. The circuit board 104 also includes conductive traces for coupling components of the circuit chip 102 to other components mounted to the circuit board 104.

The circuit board 104 also includes vias 112 that form a conductive path from the top surface 108 of the circuit board 108 to the bottom surface 110 of the circuit board 104. The circuit board 104 also includes components that are mounted to the bottom surface 110 of the circuit board 104 directly below the circuit chip 102. The vias 112 enable components mounted to the bottom surface 110 of the circuit board 104 to be electrically coupled to the circuit chip 102, including thermal relief, and signal, power and ground distribution.

Figure 2:
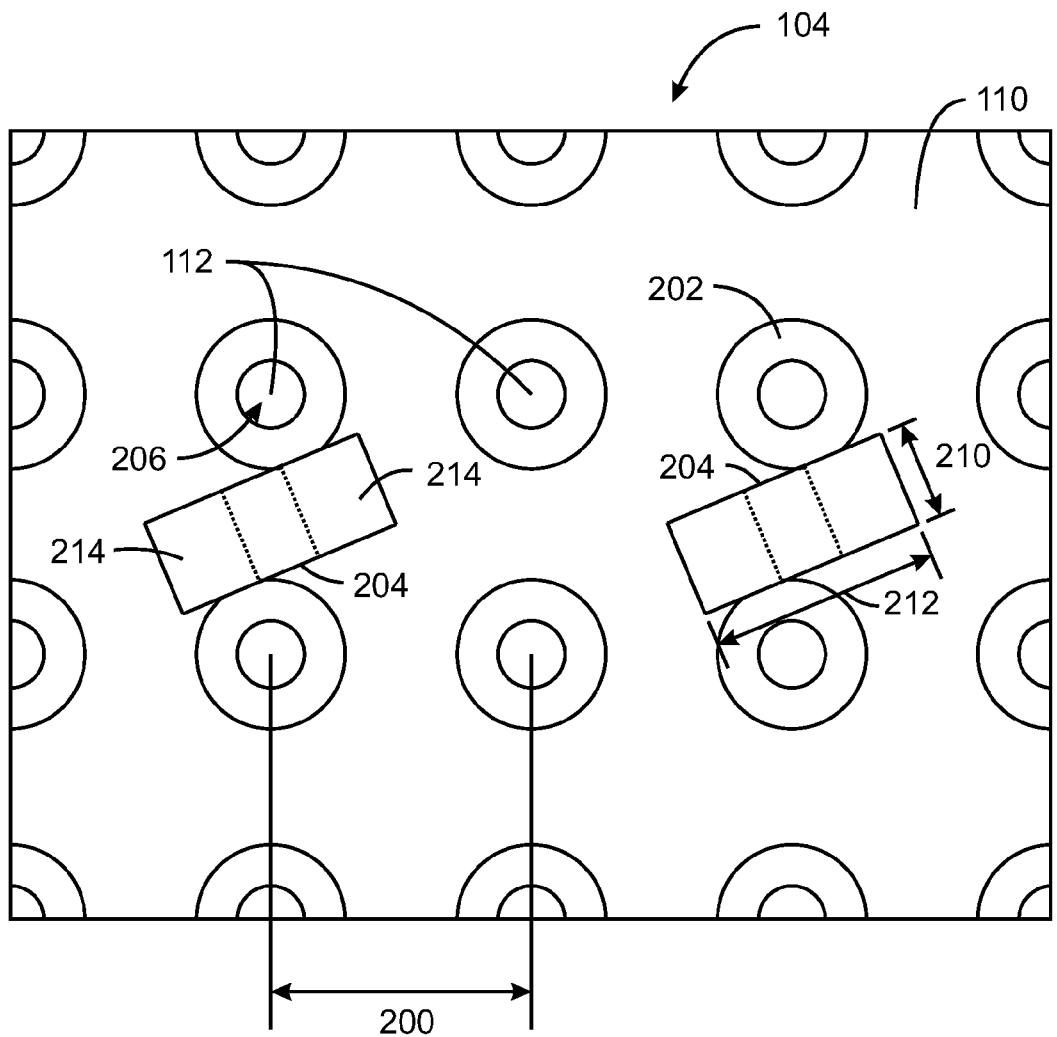
FIG. 2 is a bottom view of a portion of the circuit board, in accordance with embodiments.

FIG. 2 is a bottom view of a portion of the circuit board, in accordance with embodiments. Each of the vias 112 forms a through hole that connects the top surface (not shown) of the circuit board 104 with the bottom surface 110 of the circuit board 104. As used herein, the term "via pitch" refers to the center-to-center distance 200 between the vias 112. In embodiments, the via pitch is approximately 0.8 millimeters. However, embodiments of the present techniques may be implemented in circuit boards 104 with any suitable via pitch, including via pitch of 1.0 millimeters or more. Each via 112 may include a conductive layer formed on the walls of the via 112 to provide the conductive path through the via 112. In embodiments, the vias 112 are plugged to prevent solder from wicking through the via 112 during subsequent soldering operations. Each via 112 may be electrically coupled to a conductive pad, referred to herein as a via pad 202, which surrounds the via 112 and is electrically coupled to the conductive material within the via 112. The via pad 202 provides a conductive contact that enables other electrical components to be coupled to the circuit chip 102 (FIG. 1) through the via 112.

Some of the vias 112 may be coupled to electrical components, such as bypass capacitors 204, which are mounted to the bottom surface 110 of the circuit board 104. For example, some of the vias 112 may be power vias 206 and ground vias 208, which are vias configured to couple a power source to the circuit chip 102. As explained above, the bypass capacitors 204 are coupled across each power via 206 and its corresponding ground via 208 to filter out noise generated by the power source. The bypass capacitors 204 can also serve to dampen noise generated by the circuit chip 102 itself. For the sake of clarity, the bypass capacitors 204 are shown in transparent view. As an example, FIG. 2 shows two power vias 206, each power via associated with a corresponding ground via 208. However, it will be appreciated that the circuit board 104 can include any suitable number of power vias 206 and ground vias 208, depending on the configuration of the circuit chip 102. Furthermore, bypass capacitors 204 are only one example of a passive component that can be mounted on the bottom surface 110 of the circuit board 104 in accordance with embodiments. Other examples of components that can be mounted on the bottom surface 110 of the circuit board 104 include inductors and resistors.

As shown in FIG. 2, the bypass capacitors 204 are disposed between power via 206 and the corresponding ground via 208 such that they do not overlap the vias 112. Because the bypass capacitors do not overlap the vias 112, there is no risk of solder wicking through the vias 112 during the process of soldering the bypass capacitors 204 into place. As explained above, this enables the process of fabricating the vias 112 to be simplified, because the typical Plated Over Filled Via (POFV) process can be eliminated. The footprint of the bypass capacitors 204 will depend, in part, on the available surface area that exists between the vias 112. For example, depending on the via pitch, the width 210 of each bypass capacitor 204 may be approximately 10 mils (thousandths of an inch) and the length 212 of each bypass capacitor 204 may be approximately 20 mils. However, larger or smaller components may be placed between the vias 112 in accordance with embodiments, depending on the available area between the vias 112.

To facilitate the mounting and electrical coupling of the bypass capacitors 204, the power vias 206 and ground vias 208 may be electrically coupled to corresponding contact pads 214 disposed on the bottom surface 110 of the circuit board 104. Each bypass capacitor 204 includes corresponding contacts and is mounted over the surface of the contact pads 214. The configuration of the contact pads 214 is described further below in relation to FIG. 3.

Figure 3:
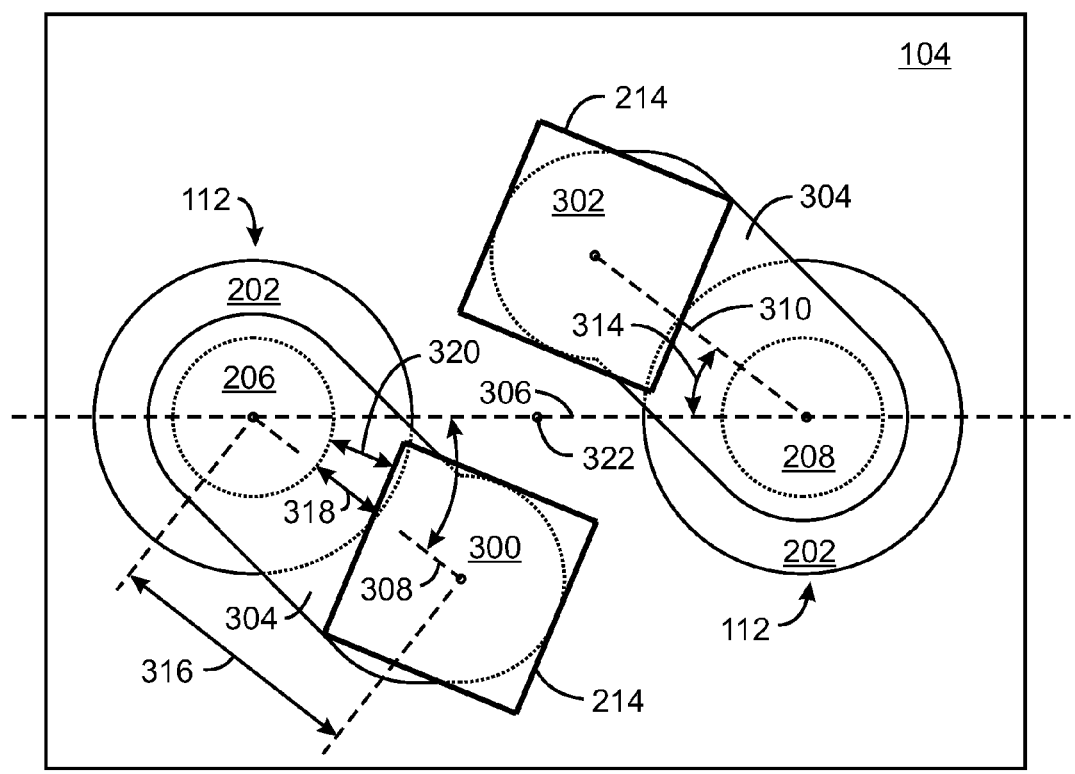
FIG. 3 is a bottom view of a portion of the circuit board, in accordance with embodiments.

FIG. 3 is a bottom view of a portion of the circuit board, in accordance with embodiments. Specifically, FIG. 3 shows a close-up view of an example of a bypass capacitor 204 disposed between a power via 206 and a ground via 208. The contact pad 114 coupled to the power via 206 may be referred herein as the power pad 300, and the contact pad 214 coupled to the ground via 208 may be referred to herein as the ground pad 302. Each of the contact pads 214 may be coupled to its respective via 112 by a conductive trace etch 304. In embodiments, each of the contact pads 214 is approximately 12 mils by 12 mils. The positions of the contact pads 214 are described in relation to three reference lines. A first reference line 306 crosses through the center of the power via 206 and the ground via 208. A second reference line 308 passes through the center of the power via 206 and the center of the power pad 300. A third reference line 310 passes through the center of the ground via 208 and the center of the ground pad 302.

As shown in FIG. 3, each contact pad 214 is disposed at an angle with respect to the first reference line 306, and the contact pads 214 are disposed on opposite sides of the first reference line 306. More specifically, the first reference line 306 and the second reference line 308 define a first angle 312, and the first reference line 306 and the third reference line 310 define a second angle 314 extending from the opposite side of the first reference line 306. In embodiments, the first angle 312 and the second angle 314 are approximately equal and both may be referred to as the placement angle. It will be appreciated that as the placement angle increases, the distance between the contact pads 214 increases and the size of the bypass capacitor 204 (FIG. 2) can also increase. Because the size of the bypass capacitor 204 determines its capacitance, the electrical characteristics of the bypass capacitor 204 can be adjusted to fit the desired electrical characteristics of a particular implementation by adjusting the placement angle. In embodiments, the placement angle is in a range from 0 degrees to 180 degrees, or from 30 degrees to 90 degrees, or any other suitable range. In embodiments, the placement angle may be approximately 67.5 degrees. In embodiments, the value of the placement angle will be such that a footprint that encompasses the power pad 300, the ground pad 302, and the area between the pads does not cover any portion of the vias 112.

As the bypass capacitor 204 is moved away from the vias 112, the inductance of the trace etch 304 will tend to reduce the effectiveness of the bypass capacitor 204. Therefore, the distance between the contact pads 214 and their respective vias 112 is, in some embodiments, kept as short as possible. In embodiments, the distance 316 from the center of the contact pad 214 to the center of its respective via 112, referred to herein as the placement distance, may be approximately 10 to 20 mils. In the example shown in FIG. 3, the distance 316 from the center of the contact pad 214 to the center of its respective via 112 is approximately 14.86 mils. In embodiments, the edge of the contact pad 214 may slightly overlap the edge of the corresponding via pad 202. In the example shown in FIG. 3, the radial extent of the via pad 202 away from the edge of the via 112, shown by the arrow 318, is approximately 4.5 mils, and the shortest distance from the edge of the via 112 to the edge of the contact pad 214, shown by the arrow 320, is approximately 4.0 mils, resulting in approximately 0.5 mils of overlap. In embodiments, the relative positioning of the power pad 300 in relation to the power via 206 is the same as the relative positioning of the ground pad 302 in relation to the ground via 208. In other words, the combination of the power via 206 and the power pad 300 will have the same outline as the combination of the ground via 208 and the ground pad 302 if rotated 180 degrees about the center point 322 between the power via 206 and the ground via 208.

The contact pad placement described above enables the placement of a component between the vias 112 that does not cover the vias 112. It will be appreciated that the specific dimensions provided herein are meant to provide context for a better understanding of the present techniques and are not meant to be limiting. Indeed, various other placement distances and angles may be used in accordance with embodiments depending on the specifications of a specific embodiment, such as the via pitch. The specific placement distances and angles may also be adjusted to provide suitable signal integrity, depending on the type and specifications of the component disposed between the vias 112. Furthermore, although the layout described herein may be useful for fabricating a circuit board that has a small via pitch (for example, 0.8 millimeters or less) the present techniques may also be used in a circuit board with larger via pitches (for example, 1.0 millimeter or more.)

Figure 4:
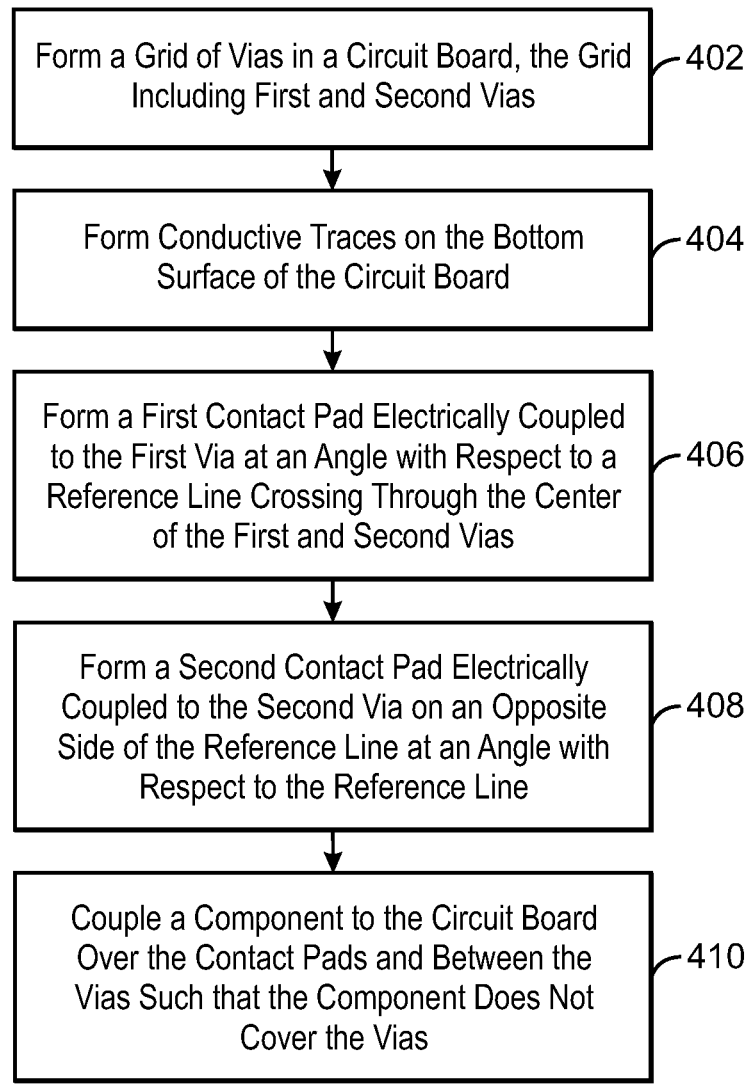
FIG. 4 is a process flow diagram of a method of fabricating a circuit board, in accordance with embodiments.

FIG. 4 is a process flow diagram of a method of fabricating a circuit board, in accordance with embodiments. The method may begin at block 402 wherein a grid of vias is formed in a circuit board. The grid of vias includes at a first via, which may be a power via, and a second via, which may be the corresponding ground via. The power via and ground via are configured to couple a circuit chip to a power supply. During the formation of the vias a conductive material may be disposed on the walls of the via. The conductive material may also extend over the bottom surface of the circuit board to form a via pad that enables electrical contact with the via.

At block 404, conductive traces are formed on the bottom surface of the circuit board. The conductive traces provide electrical coupling between the vias and the contact pads that are formed at blocks 406 and 408.

At block 406 a first contact pad is formed on the bottom surface of the circuit board and electrically coupled to the first via. As described above, the first contact pad may be formed at an angle with respect to a reference line crossing through the center of the first via and second via. In embodiments, the first contact pad is formed as close as possible to the via pad surrounding the first via. In embodiments, the first contact pad may slightly overlap the via pad of the first via.

At block 408, a second contact pad is formed on the bottom surface of the circuit board and electrically coupled to the second via. As described above, the second contact pad may be formed at an angle with respect to the reference line crossing through the center of the first via and the second via. Further, the second contact pad is formed on the opposite side of the reference line compared to the first contact pad, forming juxtaposed contact pads over which an electrical component can be disposed between the vias without covering the vias. As with the first contact pad, the second contact pad may be formed as close as possible to the via pad surrounding the second via. In embodiments, the second contact pad may slightly overlap the via pad of the second via. The placement distance and angle of both contact pads is such that the footprint that encompasses an area between the first and second contact pads does not cover any portion of the first via or the second via.

At block 410, a component such as a bypass capacitor may be coupled to the circuit board over the contact pads, such as by soldering contacts of the component to the contact pads. The positioning of the contact pads prevents the component coupled to the contact pads from covering the vias. Although embodiments are described in reference to coupling a bypass capacitor across a power via and a ground via, it will be appreciated that embodiments described herein are not limited to techniques for mounting bypass capacitors, and that the component may be any component that can be suitably mounted to the circuit board.

While the present techniques may be susceptible to various modifications and alternative forms, the exemplary embodiments discussed above have been shown only by way of example. It should be understood that the technique is not intended to be limited to the particular embodiments disclosed herein. Indeed, the present techniques include all alternatives, modifications, and equivalents falling within the true spirit and scope of the appended claims.

What is claimed is:

1. A circuit board, comprising:
a uniform grid of vias, including a first via and a second via, the first and second vias providing an electrical path from a top surface of the circuit board to a bottom surface of the circuit board;
a first contact pad electrically coupled to the first via and a second contact pad electrically coupled to the second via;
wherein the first contact pad is disposed at a first angle with respect to a reference line crossing through the center of the first via and the center of the second via, and the second contact pad is disposed on an opposite side of the reference line at a second angle with respect to the reference line; and
wherein a footprint that encompasses an area between the first and second contact pads does not cover any of the vias in the uniform grid of vias.

2. The circuit board of claim 1, comprising a via pad disposed on the bottom surface of the circuit board around the via, wherein the first contact pad overlaps a portion of the via pad.

3. The circuit board of claim 1, wherein a distance between the center of the first via and a center of the first contact pad is approximately 10 to 20 mils.

4. The circuit board of claim 1, wherein a distance between the center of the first via and a center of the first contact pad is approximately 14.86 mils.

5. The circuit board of claim 1, wherein the first angle and the second angle are approximately equal and are approximately 30 to 90 degrees.

6. The circuit board of claim 1, wherein the first angle and the second angle are both approximately 67.5 degrees.

7. The circuit board of claim 1, comprising an electrical component disposed over and electrically coupled to the first and second contact pads, wherein the component does not overlap the vias.

8. The circuit board of claim 7, wherein the electrical component is disposed between the first and second vias.

9. The circuit board of claim 7, wherein the first via is coupled to a power supply, the second via is coupled to ground, and the component is a bypass capacitor.

10. An electronic device, comprising:
a circuit chip mounted to a circuit board, the circuit board comprising:
a uniform grid of vias, including a first via and a second via, the first and second vias providing an electrical path from a top surface of the circuit board to a bottom surface of the circuit board;
a first contact pad electrically coupled to the first via and a second contact pad electrically coupled to the second via;
wherein the first contact pad is disposed at a first angle with respect to a reference line crossing through the center of the first via and the center of the second via, and the second contact pad is disposed on an opposite side of the reference line at a second angle with respect to the reference line; and
wherein a footprint that encompasses an area between the first and second contact pads does not cover any of the vias in the uniform grid of vias.

11. The electronic device of claim 10, wherein a center-to-center distance between each adjacent via in the uniform grid of vias is equal to or less than 0.8 millimeters.

12. The electronic device of claim 10, wherein a distance between the center of the first via and a center of the first contact pad is approximately 10 to 20 mils.

13. The electronic device of claim 10, wherein the first angle and the second angle are approximately equal and in a range from approximately 30 to 90 degrees.

14. The electronic device of claim 10, comprising an electrical component disposed over and electrically coupled to the first and second contact pads, wherein the component does not overlap the vias.

15. The electronic device of claim 10, wherein the first via is coupled to a power supply, the second via is coupled to ground, and the component is a bypass capacitor.

16. The electronic device of claim 10, wherein the electronic device comprises at least one of a computer, server, notebook, workstation, tablet PC, a mobile phone, and a smart phone.

17. A method comprising:
forming a uniform grid of vias in a circuit board, the uniform grid of vias comprising a first via and a second via;
forming a first contact pad electrically coupled to the first via at a first angle with respect to a reference line crossing through the center of the first via and the center of the second via; and
forming a second contact pad electrically coupled to the second via on an opposite side of the reference line at a second angle with respect to the reference line, wherein a footprint that encompasses an area between the first and second contact pads does not cover any via in the uniform grid of vias.

18. The method of claim 17, comprising coupling a bypass capacitor to the first and second contact pads, wherein the bypass capacitor does not overlap the vias when coupled to the first and second contact pads.

19. The method of claim 18, wherein a center-to-center distance between each adjacent via in the uniform grid of vias is equal to or less than 0.8 millimeters and the bypass capacitor is disposed between the first and second vias.

20. The method of claim 18, wherein the first angle and the second angle are both less than 180 degrees.

* * * * *